(12) United States Patent
Wei

(10) Patent No.: US 9,583,351 B2
(45) Date of Patent: Feb. 28, 2017

(54) INVERTED CONTACT

(71) Applicant: GLOBALFOUNDRIES Inc., Grand Cayman (KY)

(72) Inventor: Andy Wei, Queensbury, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/083,604

(22) Filed: Nov. 19, 2013

(65) Prior Publication Data

US 2015/0137194 A1 May 21, 2015

(51) Int. Cl.
*H01L 21/283* (2006.01)
*H01L 29/417* (2006.01)
*H01L 21/768* (2006.01)

(52) U.S. Cl.
CPC ...... *H01L 21/283* (2013.01); *H01L 21/76897* (2013.01); *H01L 29/41791* (2013.01)

(58) Field of Classification Search
CPC .............. H01L 21/768; H01L 21/3116; H01L 21/32139; H01L 29/785; H01L 21/283; H01L 27/417; H01L 29/41758; H01L 29/772; H01L 21/76897; H01L 29/417; H01L 29/41791
See application file for complete search history.

(56) References Cited

U.S. PATENT DOCUMENTS

| | | | |
|---|---|---|---|
| 6,164,781 A * | 12/2000 | Tsang et al. | 257/347 |
| 7,109,102 B2 | 9/2006 | Bohr | |
| 7,713,818 B2 | 5/2010 | Chan | |
| 2002/0008261 A1* | 1/2002 | Nishiyama | 257/288 |
| 2007/0077748 A1* | 4/2007 | Olligs | H01L 21/76838 438/618 |
| 2008/0296667 A1* | 12/2008 | Mikasa | 257/327 |
| 2012/0038056 A1* | 2/2012 | Cabral et al. | 257/774 |
| 2012/0104466 A1* | 5/2012 | Zhu | H01L 23/485 257/255 |
| 2012/0161321 A1 | 6/2012 | Haverty et al. | |
| 2012/0261772 A1* | 10/2012 | Yin et al. | 257/411 |
| 2012/0273798 A1* | 11/2012 | Alptekin | H01L 29/7833 257/77 |
| 2013/0234203 A1* | 9/2013 | Tsai et al. | 257/190 |
| 2015/0035017 A1* | 2/2015 | Wann et al. | 257/288 |

* cited by examiner

*Primary Examiner* — Fazli Erdem
(74) *Attorney, Agent, or Firm* — Williams Morgan, P.C.

(57) ABSTRACT

An inverted contact and methods of fabrication are provided. A sacrificial layer is patterned in an inverted trapezoid shape, and oxide is deposited around the pattern. The sacrificial layer is removed, and a metal contact material is deposited, taking an inverted-trapezoid shape. Embodiments of the present invention provide an inverted contact, having a wider base and a narrower top. The wider base provides improved electrical contact to the underlying active area. The narrower top allows for closer placement of adjacent contacts, serving to increase overall circuit density of an integrated circuit.

15 Claims, 18 Drawing Sheets

US 9,583,351 B2

INVERTED CONTACT

FIELD OF THE INVENTION

The present invention relates generally to semiconductors and, more particularly, to semiconductor contacts and methods of fabrication.

BACKGROUND

As integrated circuits continue to scale downward in size, the finFET (fin field effect transistor) is becoming an attractive device for use with smaller critical dimensions. In a finFET, the channel is formed by a semiconductor fin, and a gate electrode is located on at least two sides of the fin. Due to the advantageous feature of full depletion in a finFET, the increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. A finFET device generally has faster switching times, equivalent or higher current density, and much improved short channel control than planar CMOS technology utilizing similar critical dimensions. In forming a functional integrated circuit, contacts are formed, which connect gates and source/drain regions of the finFETs to other elements, such as other transistors, diodes, resistors, and the like. Typically, one or more metallization layers in the back-end-of-line (BEOL) stack are used to complete the connections. Hence, contact formation is an integral part of fabricating a functional integrated circuit. It is therefore desirable to have improvements in semiconductor contacts and methods of fabrication.

SUMMARY

In a first aspect, embodiments of the present invention provide a semiconductor structure comprising: a semiconductor substrate; a transistor formed in the semiconductor substrate, wherein the transistor comprises a gate and a source/drain region; and a contact disposed on the source/drain region, wherein the contact has a base portion that is wider than a top portion, and wherein the contact has an acute lower interior angle.

In a second aspect, embodiments of the present invention provide a semiconductor structure comprising: a semiconductor substrate; a transistor formed in the semiconductor substrate, wherein the transistor comprises a gate and a source/drain region; a first contact disposed on the source/drain region, wherein the first contact has a base portion that is wider than a top portion, and wherein the first contact has an acute lower interior angle; and a second contact disposed on the first contact.

In a third aspect, embodiments of the present invention provide a method of forming a semiconductor structure, comprising: forming a plurality of gates and source/drain regions on a semiconductor substrate; forming a protective layer disposed over the plurality of gates; forming a contact etch stop layer on the semiconductor structure; depositing a sacrificial layer on the semiconductor structure; depositing a mask on the sacrificial layer; patterning the sacrificial layer such that an acute lower interior angle is formed; depositing an oxide region on the sacrificial layer; removing the sacrificial layer; removing the contact etch stop layer; depositing a metal contact material; and planarizing the metal contact material.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Often, similar elements may be referred to by similar numbers in various figures (FIGs) of the drawing, in which case typically the last two significant digits may be the same, the most significant digit being the number of the drawing figure (FIG.).

Figure 1:
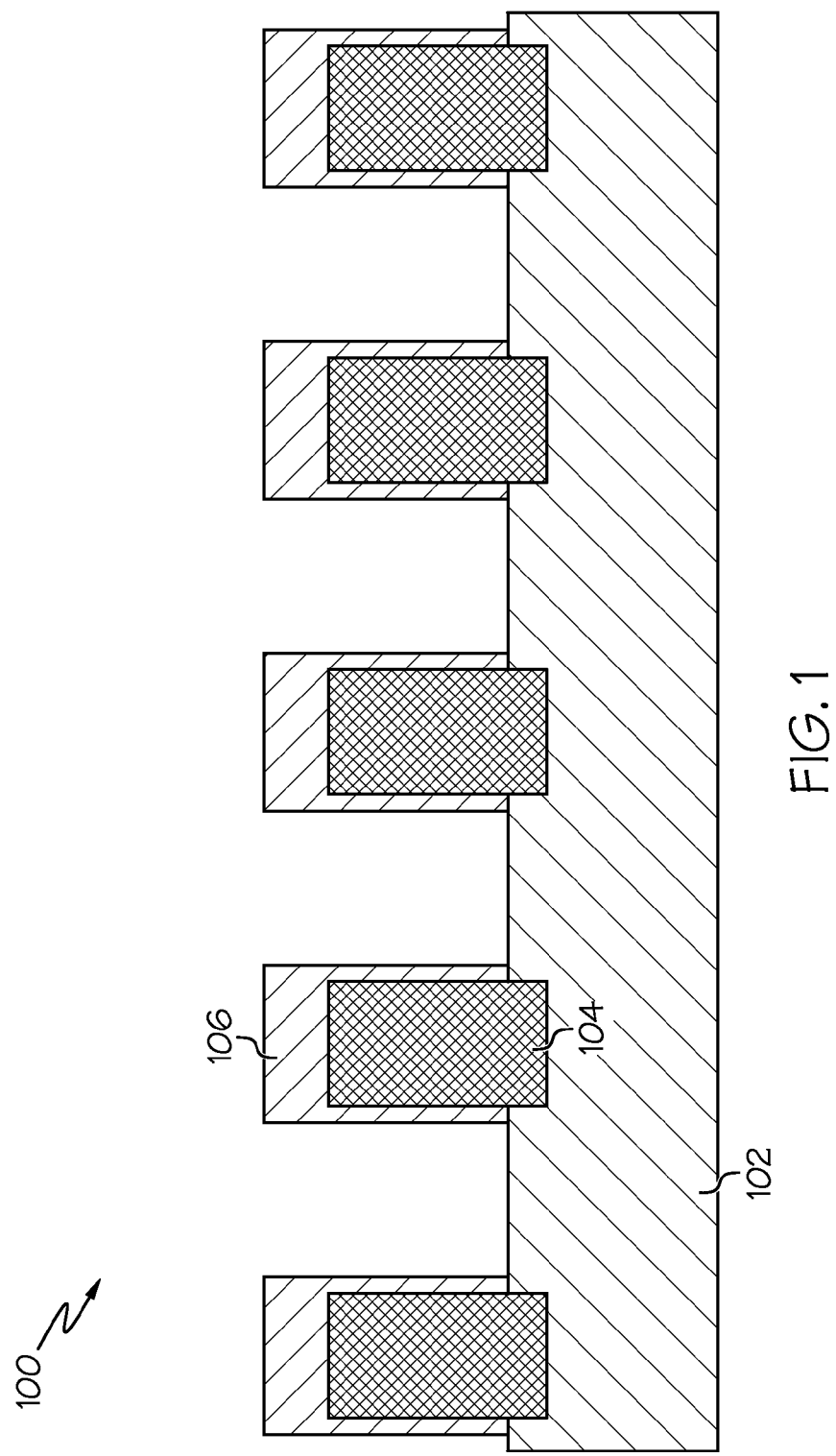
Figure 2:
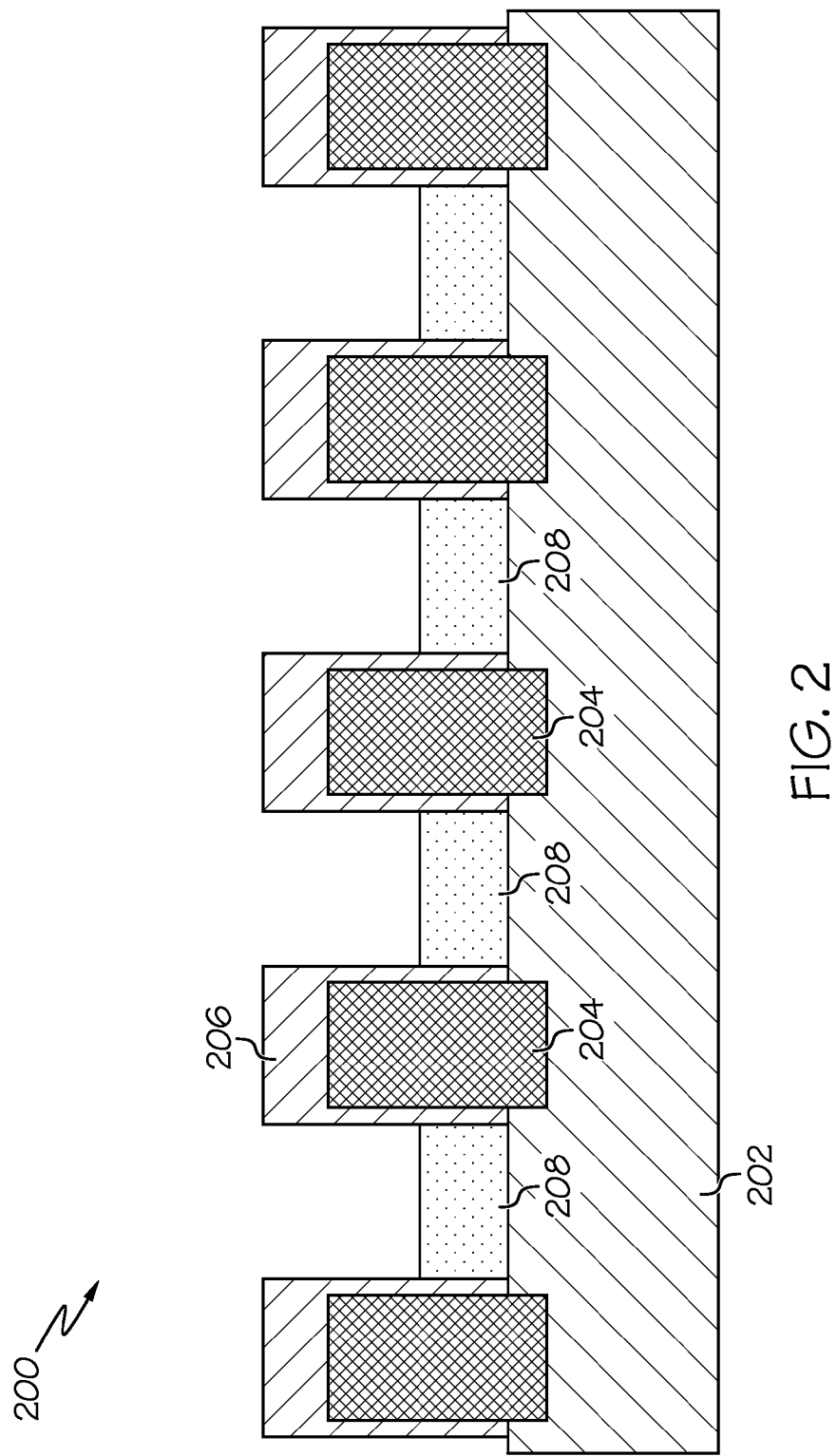
Figure 3:
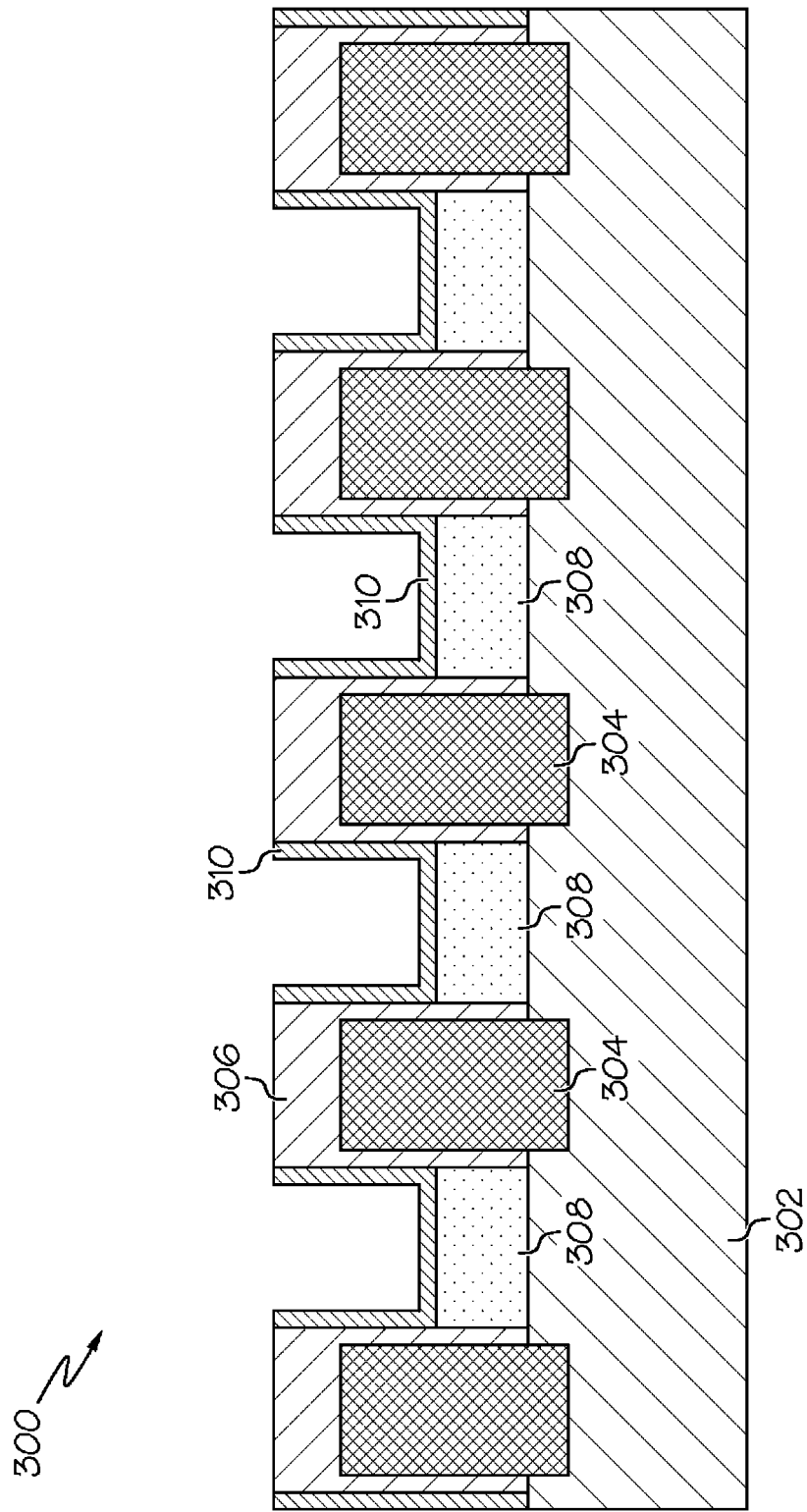
Figure 4:
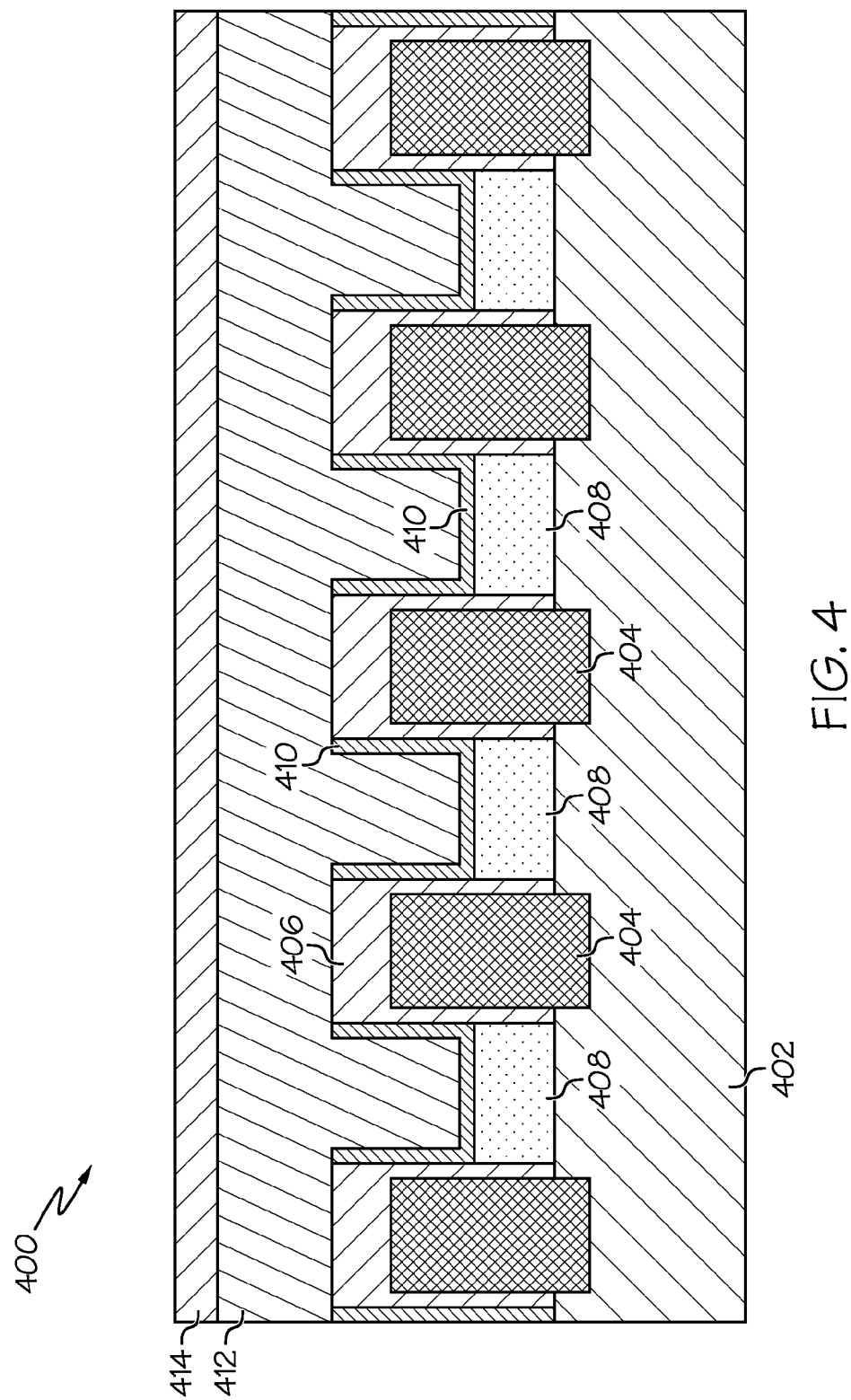
Figure 5:
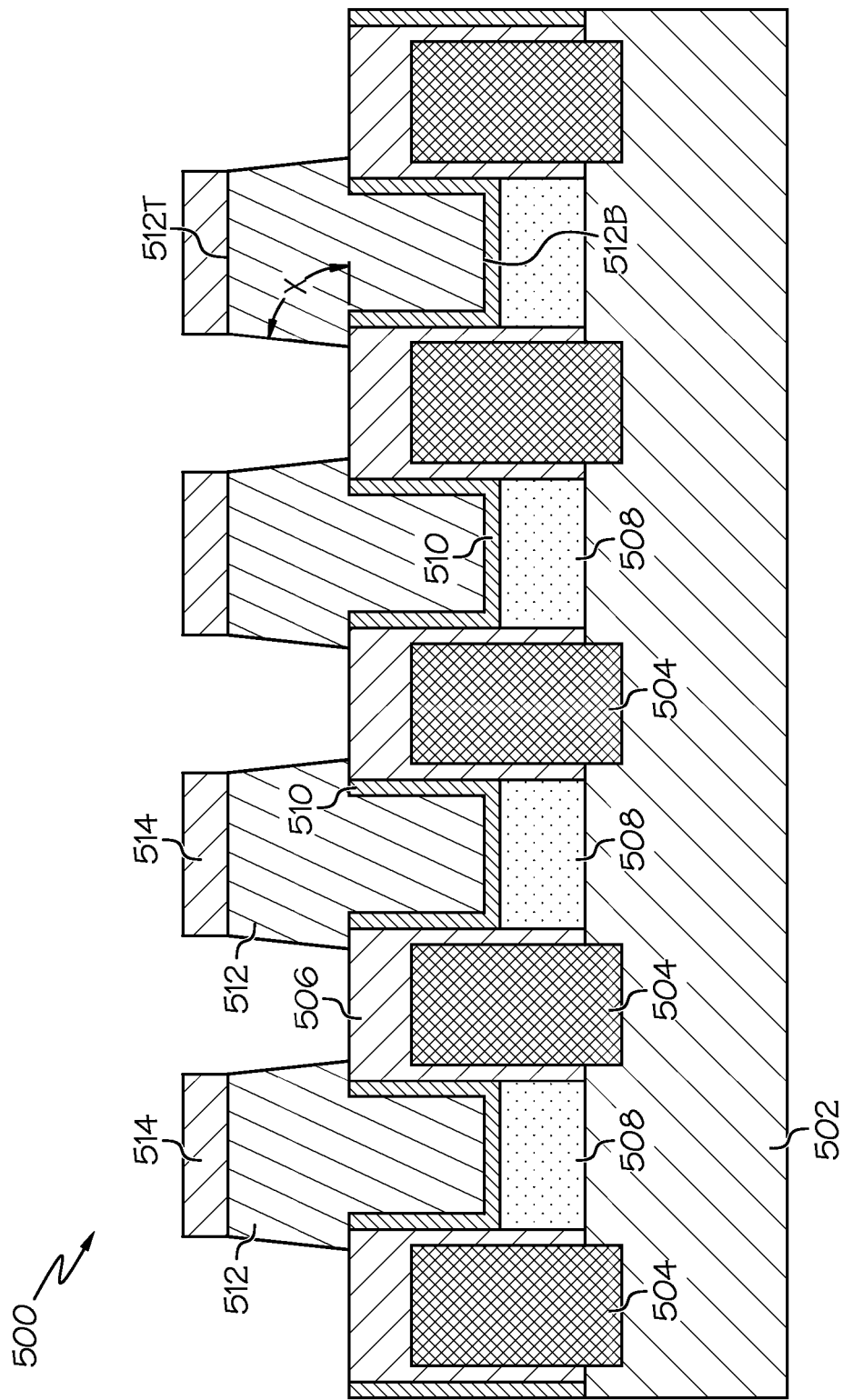
Figure 6:
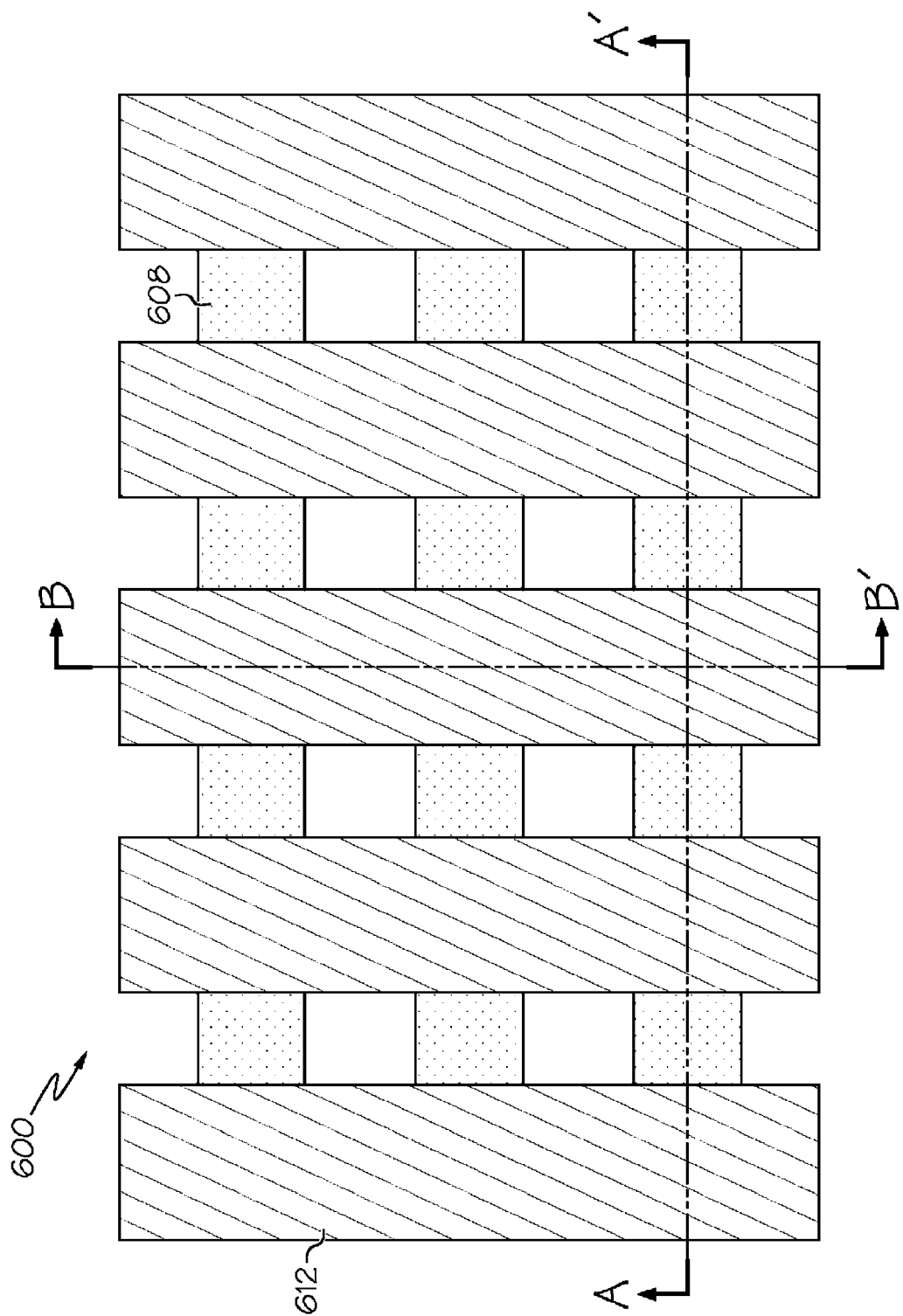

Features of this invention will be more readily understood from the following detailed description of the various aspects of the invention taken in conjunction with the accompanying drawings in which:

FIG. 1 is a semiconductor structure at a starting point for illustrative embodiments;

FIG. 2 is a semiconductor structure after a subsequent process step of forming epitaxial regions, in accordance with illustrative embodiments;

FIG. 3 is a semiconductor structure after a subsequent process step of depositing a contact etch stop layer, in accordance with illustrative embodiments;

FIG. 4 is a semiconductor structure after a subsequent process step of depositing a sacrificial layer, in accordance with illustrative embodiments;

FIG. 5 is a semiconductor structure after a subsequent process step of patterning the sacrificial layer, in accordance with illustrative embodiments;

FIG. 6 is a top-down view of a semiconductor structure in accordance with illustrative embodiments.

Figure 7:
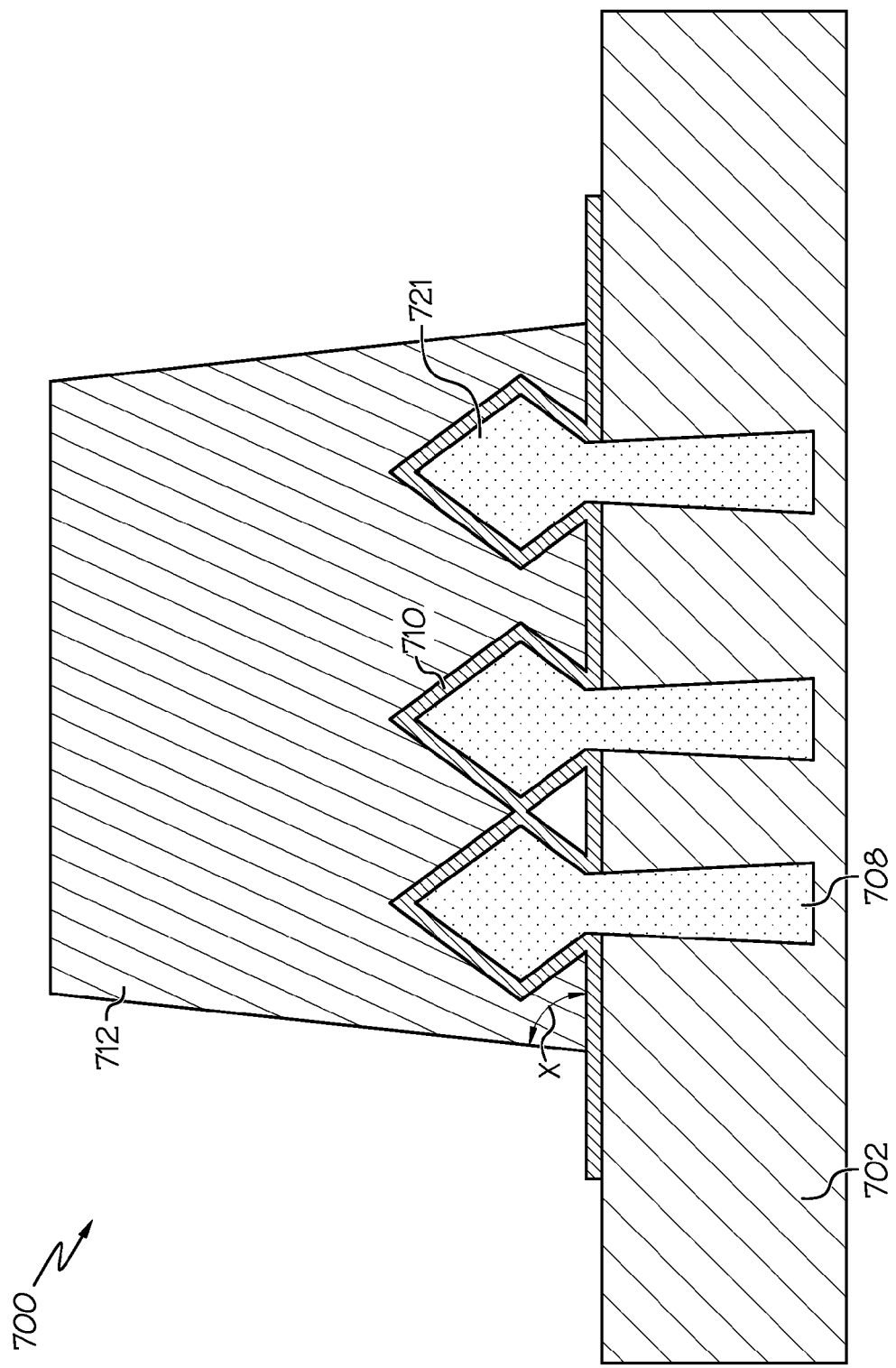
Figure 8:
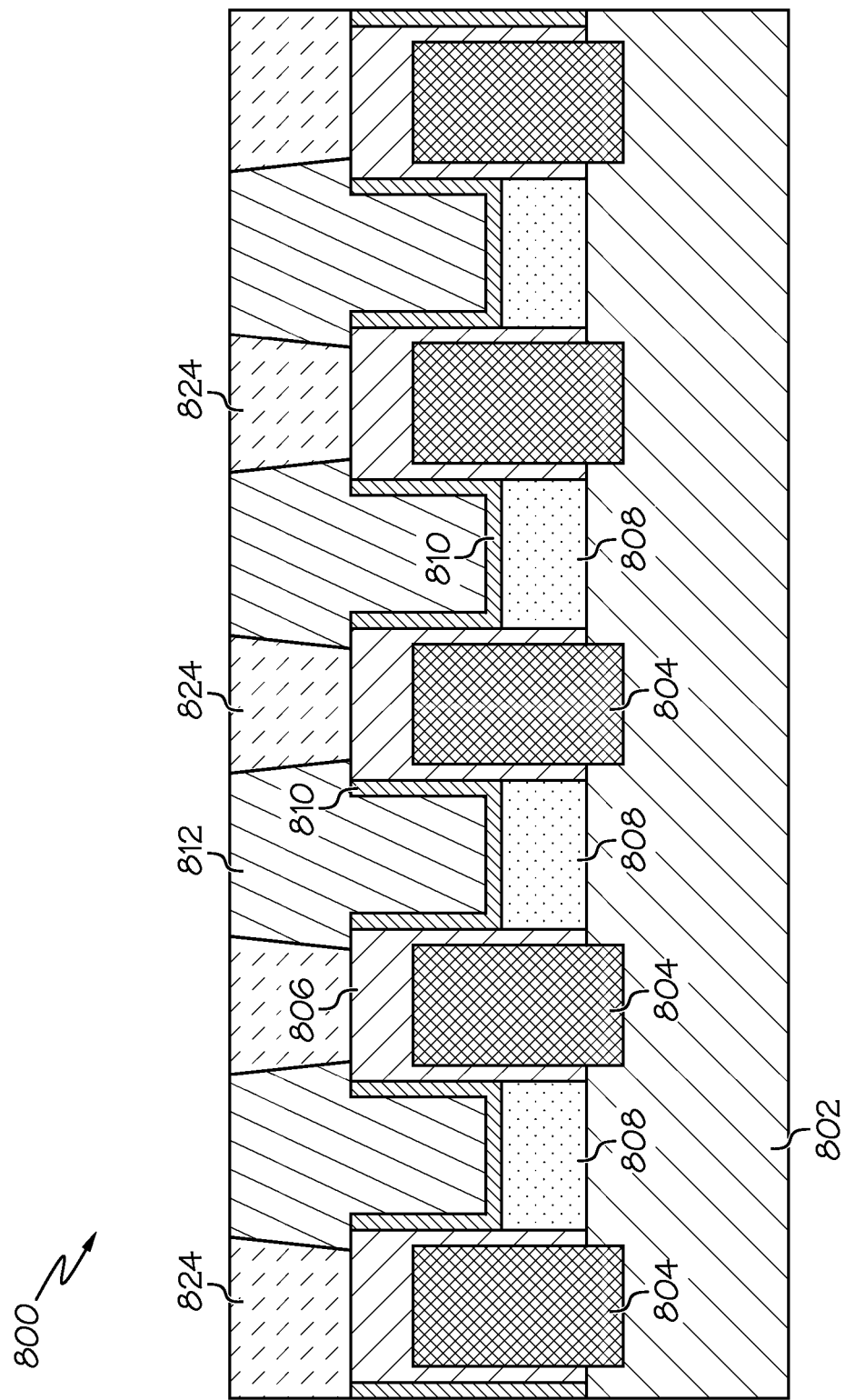
Figure 9:
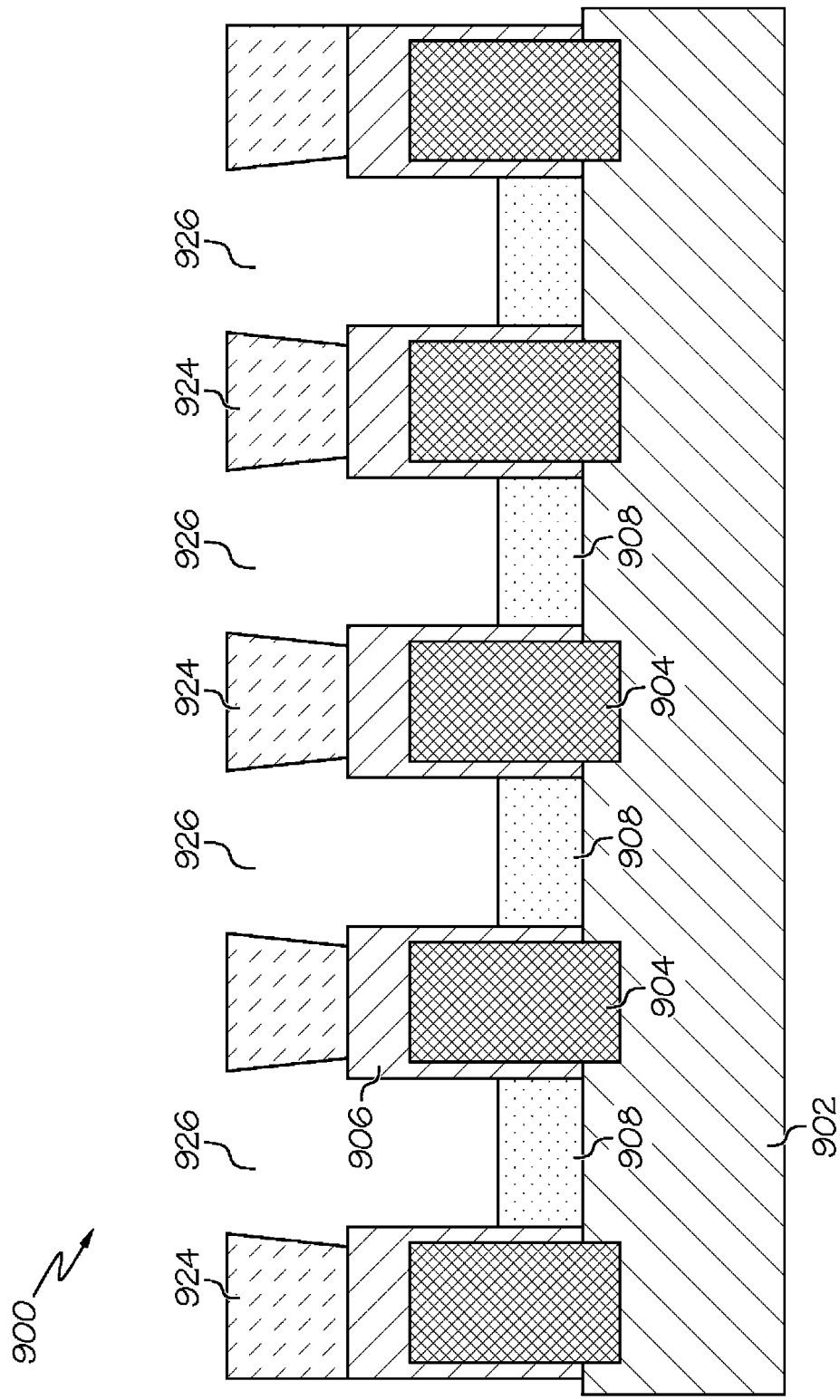
Figure 10:
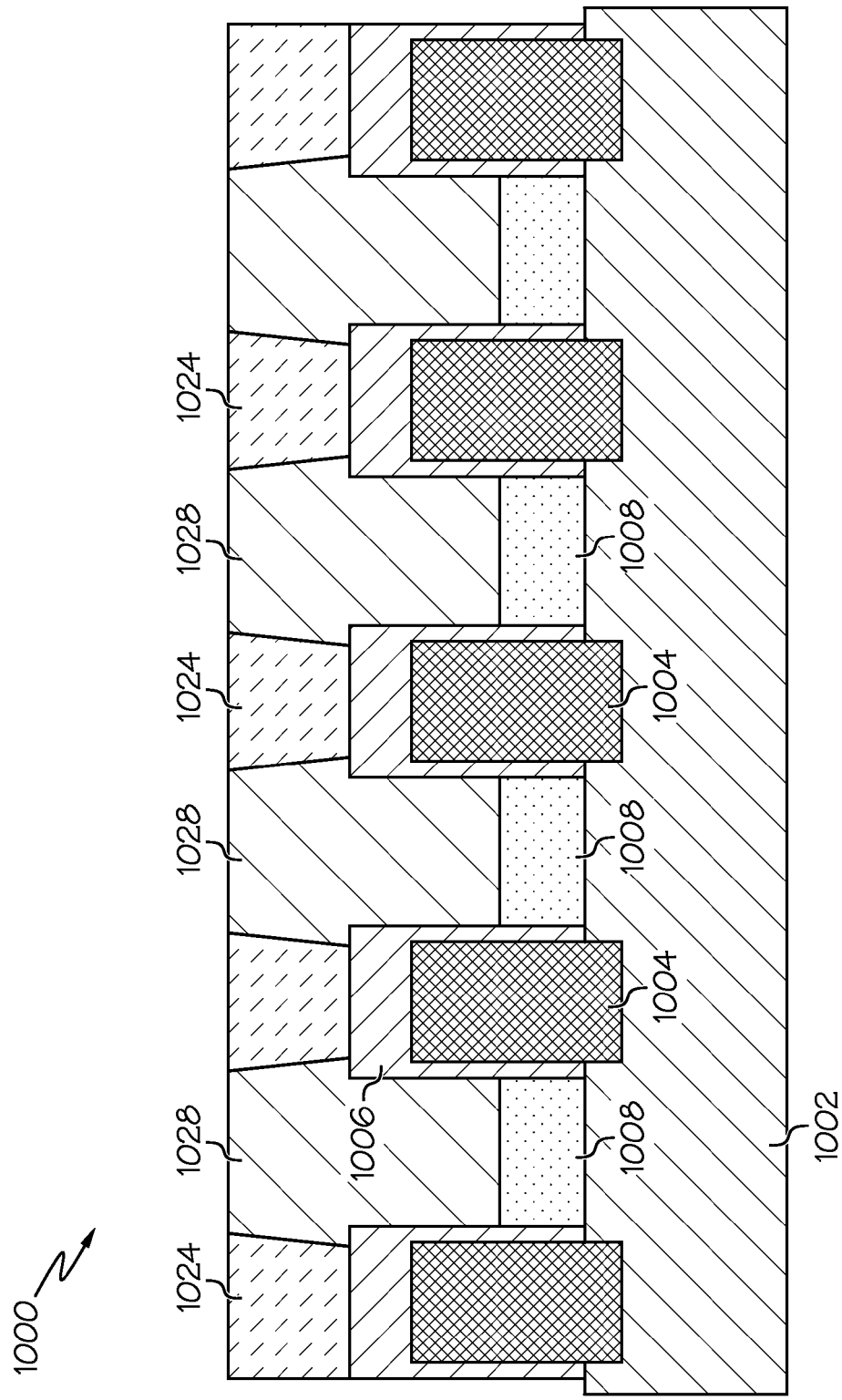
Figure 11:
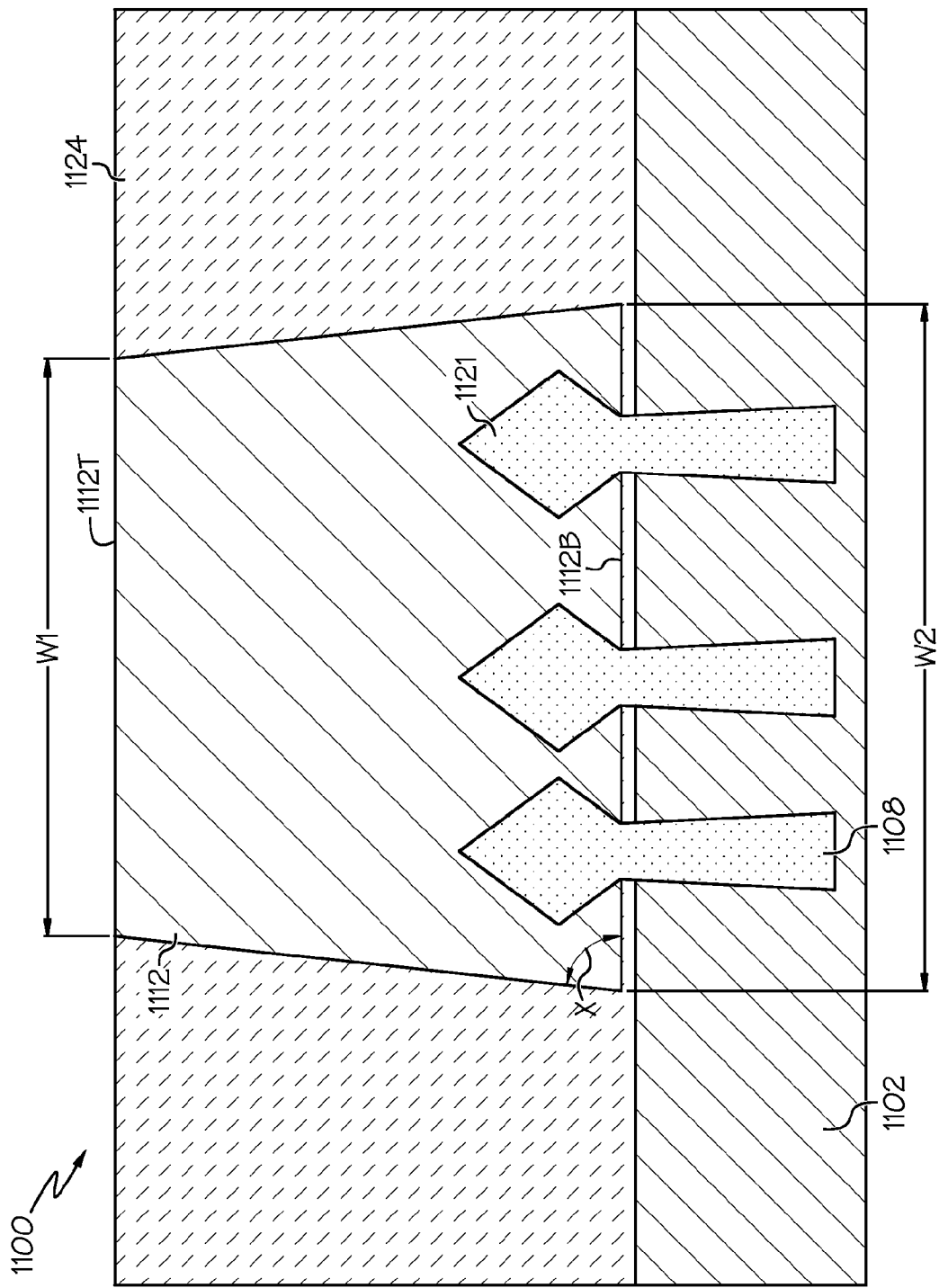
Figure 12:
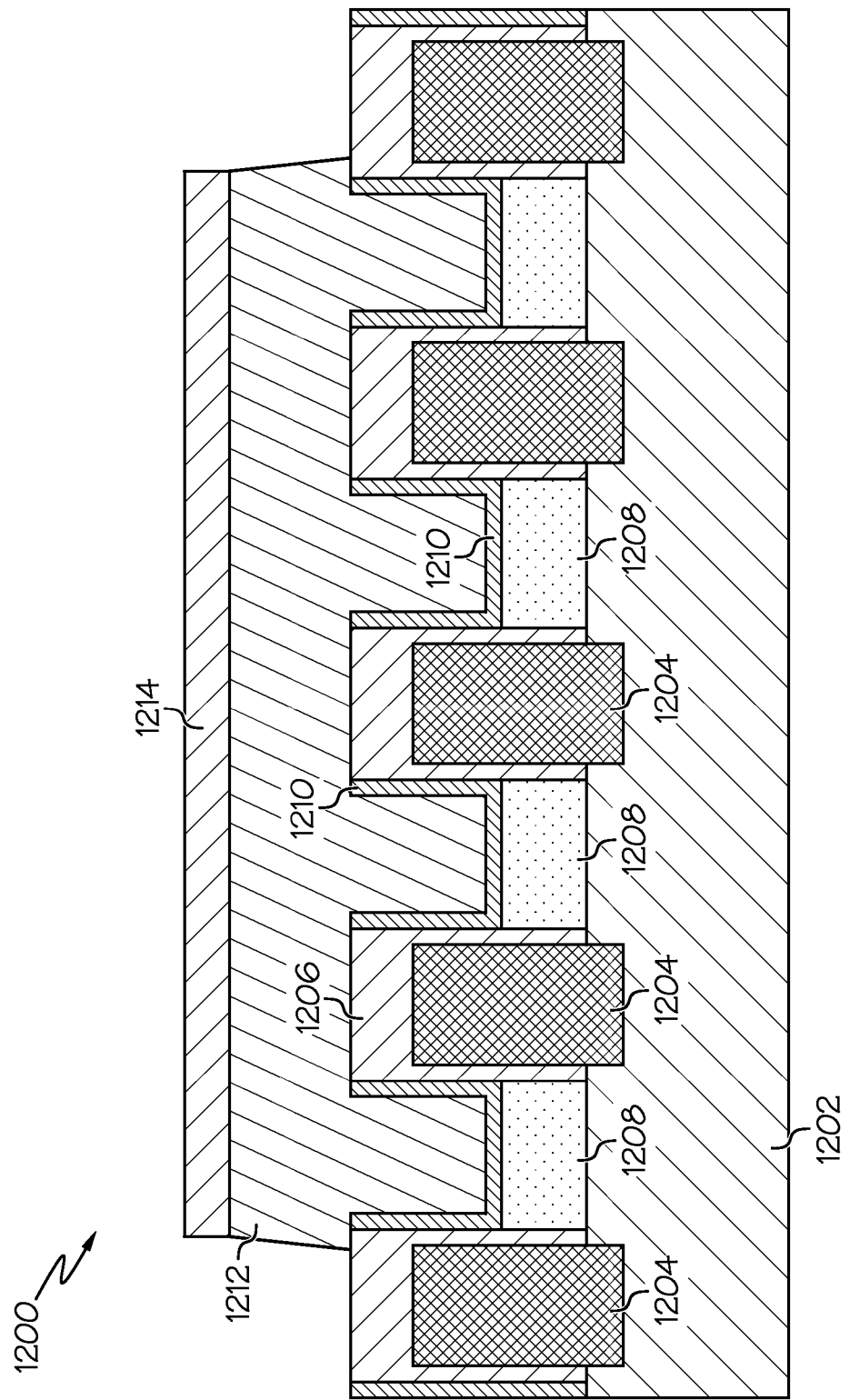
Figure 13:
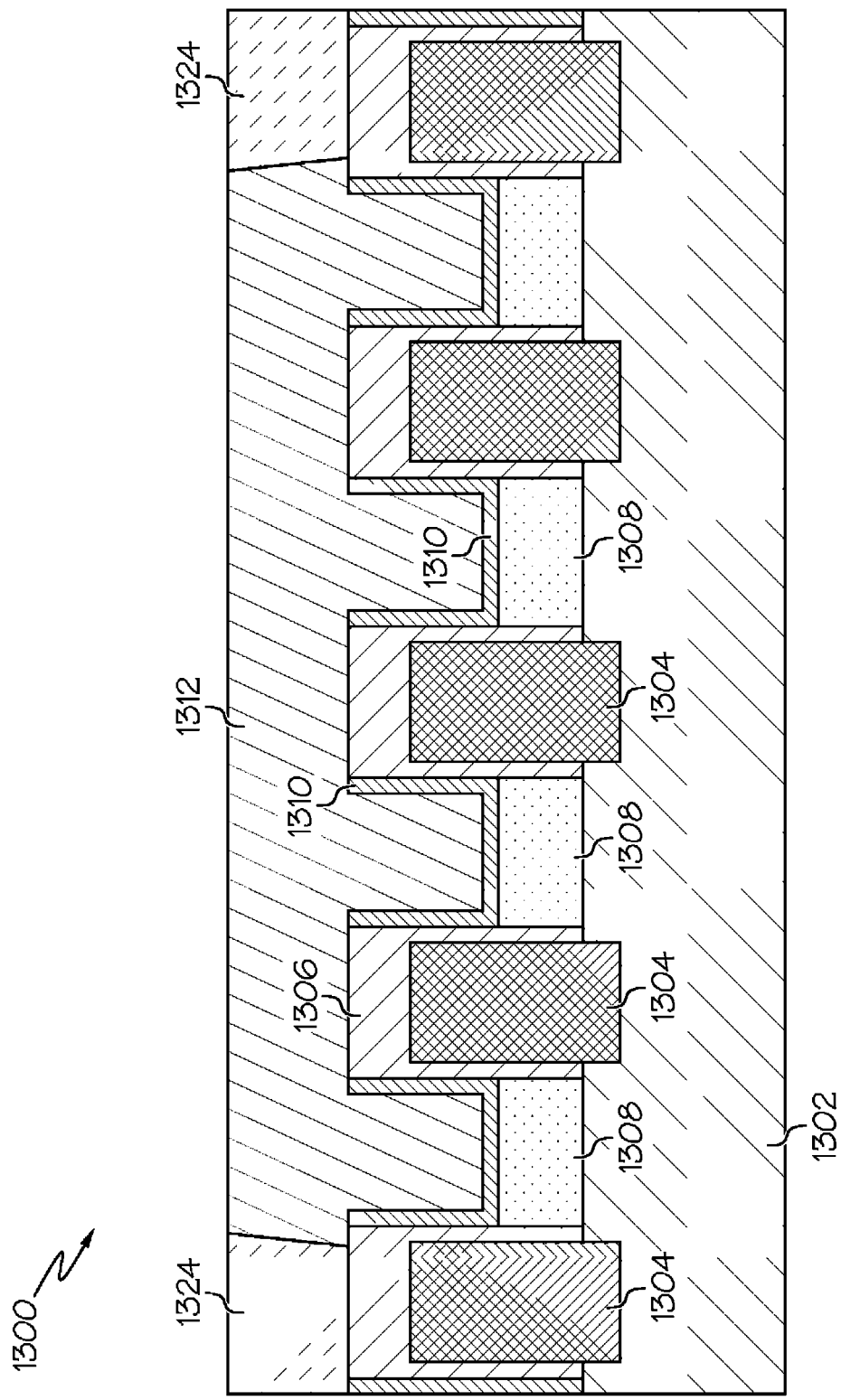
Figure 14:
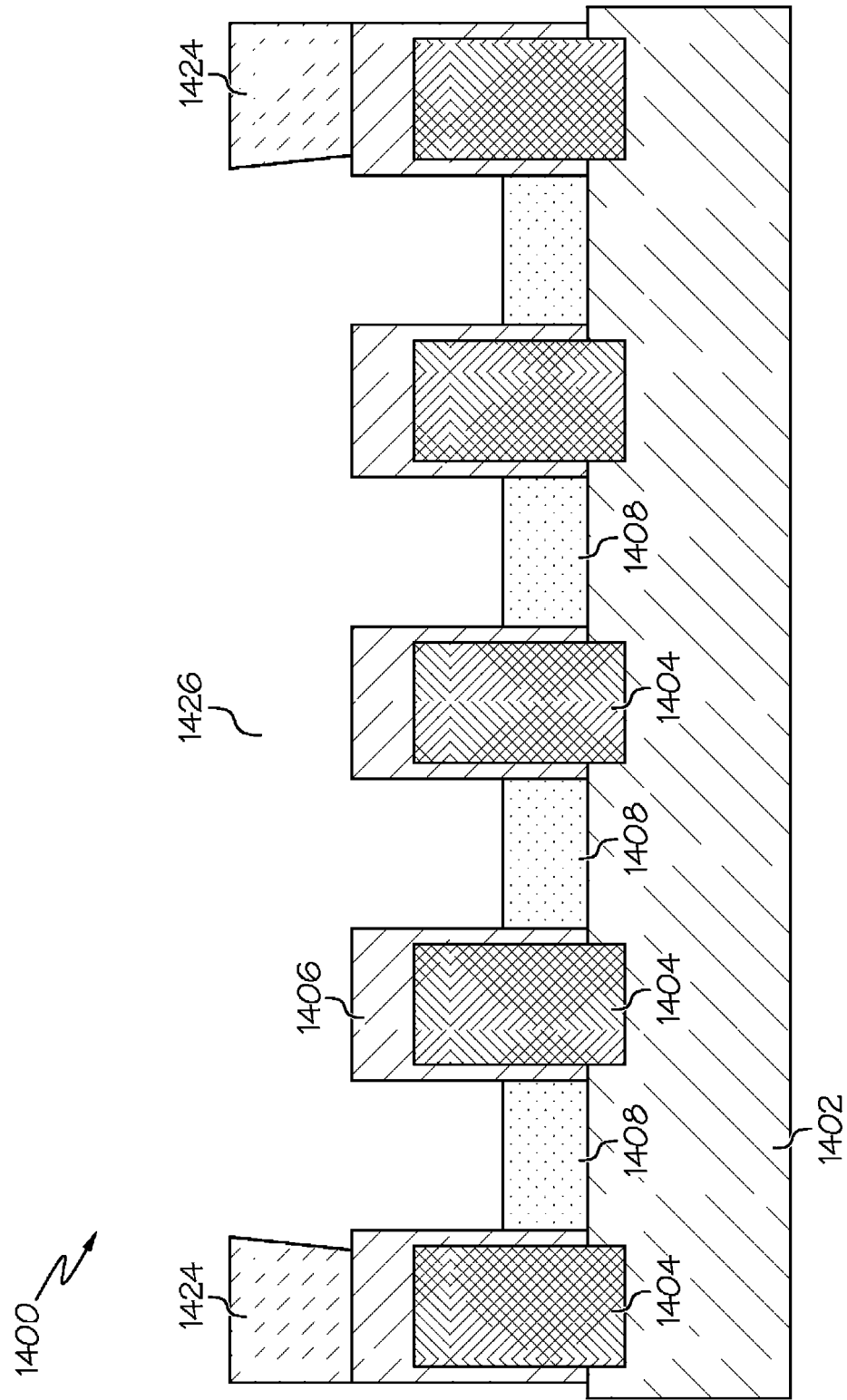
Figure 15:
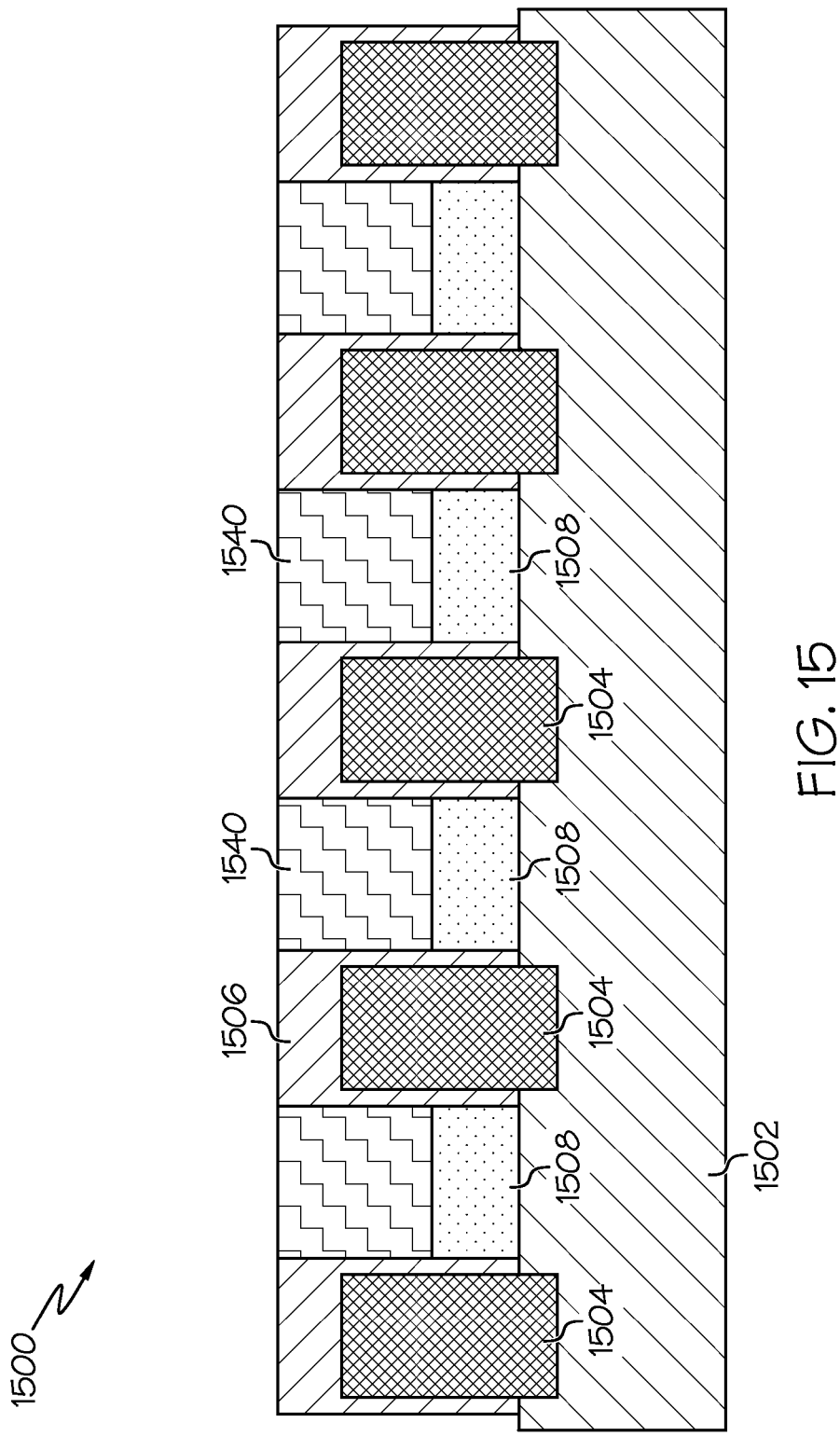
Figure 16A:
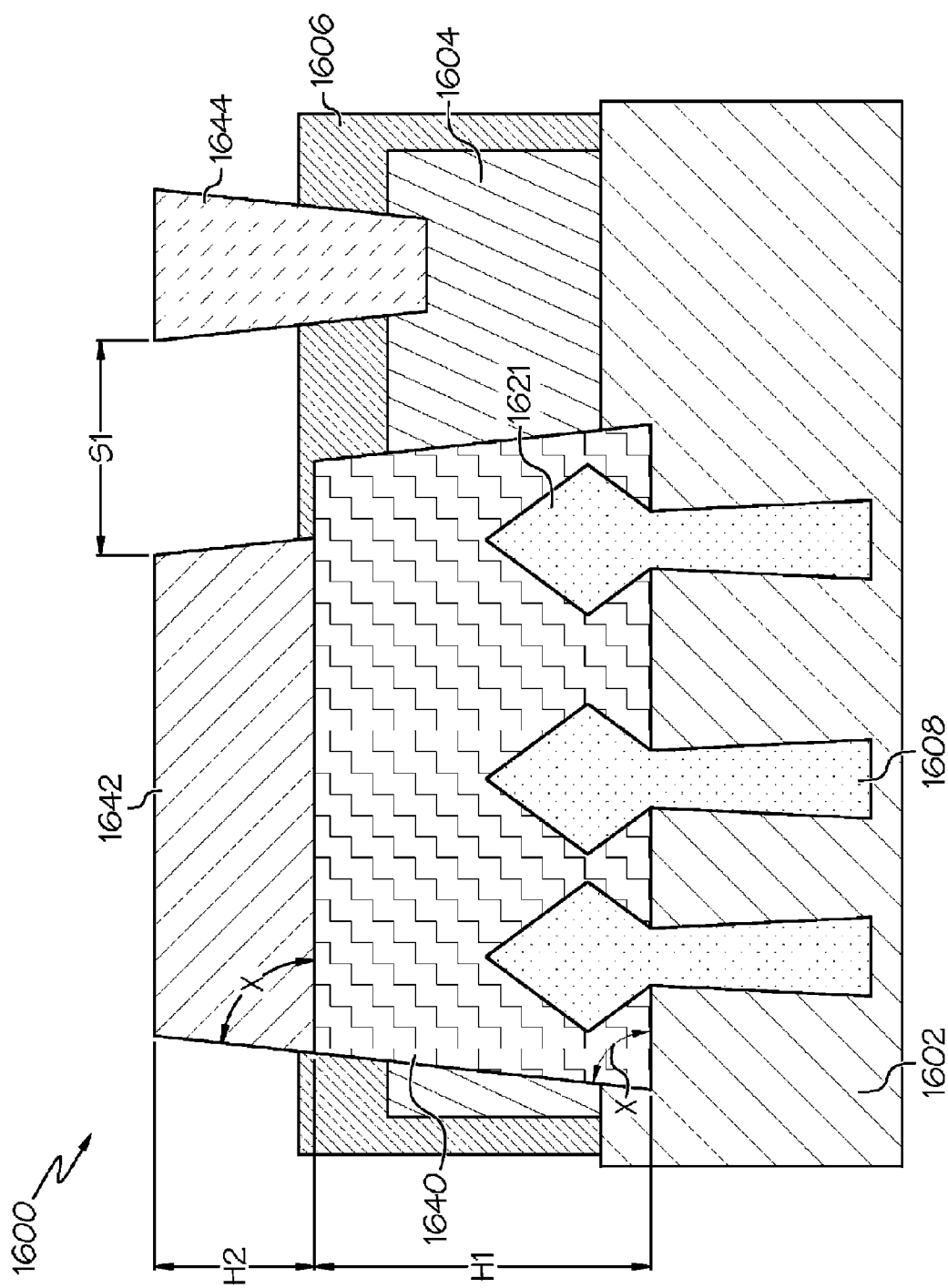
Figure 16B:
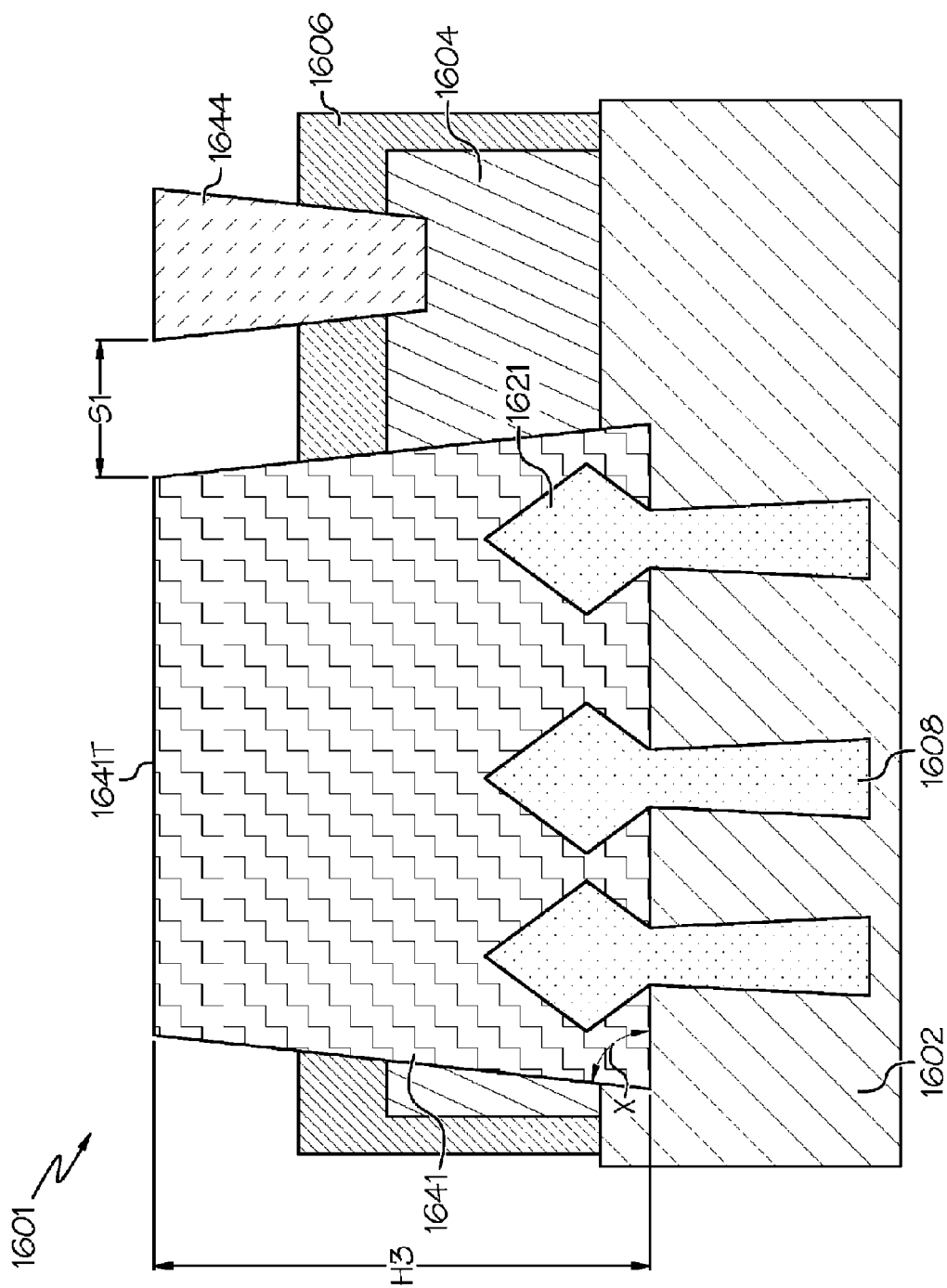
Figure 17:
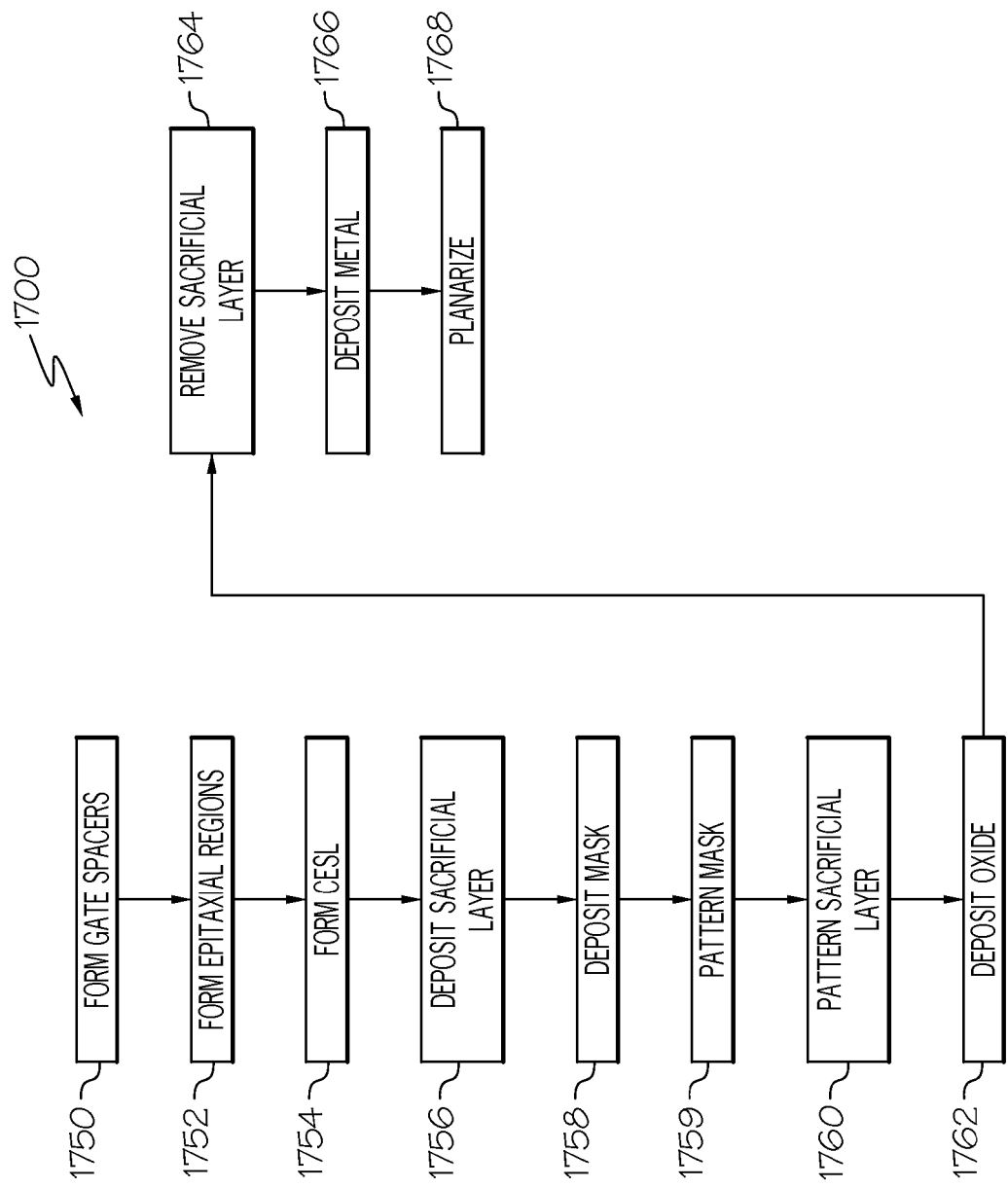

FIG. 7 is a semiconductor structure similar to that of FIG. 5, shown in a side cross-section view along line B-B' of FIG. 6;

FIG. 8 is a semiconductor structure after a subsequent process step of depositing an oxide layer, in accordance with illustrative embodiments;

FIG. 9 is a semiconductor structure after a subsequent process step of removing the sacrificial layer, in accordance with illustrative embodiments;

FIG. 10 is a semiconductor structure after a subsequent process step of depositing a metal contact material, in accordance with illustrative embodiments;

FIG. 11 is a semiconductor structure similar to that of FIG. 10, shown in a side cross-section view;

FIG. 12 is a semiconductor structure after a subsequent process step of patterning the sacrificial layer, in accordance with alternative illustrative embodiments;

FIG. 13 is a semiconductor structure after a subsequent process step of depositing an oxide layer, in accordance with alternative illustrative embodiments;

FIG. 14 is a semiconductor structure after a subsequent process step of removing the sacrificial layer, in accordance with alternative illustrative embodiments;

FIG. 15 is a semiconductor structure after a subsequent process step of depositing a metal contact material, in accordance with alternative illustrative embodiments;

FIG. 16A is a side cross-section of a semiconductor structure after subsequent steps of forming additional contacts;

FIG. 16B is a side cross-section of a semiconductor structure after subsequent steps of forming additional contacts for alternative embodiments; and FIG. 17 is a flowchart indicating process steps for embodiments of the present invention.

DETAILED DESCRIPTION

Embodiments of the present invention provide an inverted contact and methods of fabrication. A sacrificial layer is patterned in an inverted trapezoid shape, and oxide is deposited around the pattern. The sacrificial layer is removed, and a metal contact material is deposited, taking an inverted-trapezoid shape. As technologies shrink and contacts need to be doubled, or multiple patterned, the available space between contacts becomes a technology limiter. In particular, the space between the source/drain local interconnect (CA) and the gate local interconnect (CB) becomes a critical factor. Also, the space between an S/D local interconnect (CA) to another (CA) which is patterned by another lithographic step also becomes a critical factor. Embodiments of the present invention provide an inverted contact, having a wider base and a narrower top. The wider base provides improved electrical contact to the underlying active area. The narrower top allows for closer placement of adjacent contacts, serving to increase overall circuit density of an integrated circuit.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

FIG. 1 is a semiconductor structure 100 at a starting point for illustrative embodiments. Semiconductor structure 100 comprises semiconductor substrate 102, which may include a silicon substrate such as a bulk silicon substrate or silicon-on-insulator substrate. A plurality of gates 104 are formed on the semiconductor substrate 102. The gates 104 may be formed of polysilicon. In other embodiments, the gates 104 may be comprised of one or more metals, and may be formed by a replacement metal gate (RMG) process. A gate protective layer 106 is disposed on the gate 104. In embodiments, the protective layer 106 may be a conformal protective layer, and may be comprised of SiN (silicon nitride), SiON (silicon oxynitride), or SiOCN (Silicon oxygen carbon nitride). The protective layer 106 serves as a gate spacer.

FIG. 2 is a semiconductor structure 200 after a subsequent process step of forming epitaxial regions, in accordance with illustrative embodiments. As stated previously, similar elements may be referred to by similar numbers in various figures (FIGs) of the drawing, in which case typically the last two significant digits may be the same. For example, substrate 202 of FIG. 2 is similar to substrate 102 of FIG. 1. Epitaxial regions 208 are formed in between the gates 204. In embodiments, the epitaxial regions 208 may be comprised of silicon. In other embodiments, one or more of the epitaxial regions 208 may be comprised of SiGe (silicon germanium). Epitaxial regions 208 may serve as source/drain regions for a finFET.

FIG. 3 is a semiconductor structure 300 after a subsequent process step of depositing a contact etch stop layer 310, in accordance with illustrative embodiments. In embodiments, the contact etch stop layer (CESL) 310 may be comprised of SiN (silicon nitride), SiON, SiO2, or SiOCN. It is preferable that the material used for CESL 310 is different from the material used for gate protective layer 306, such that the CESL 310 can be selectively removed via a subsequent etch process. In some embodiments, CESL 310 is comprised of SiN and protective layer 306 is comprised of SiOCN. In other embodiments, CESL 310 is comprised of SiOCN and protective layer 306 is comprised of SiN.

FIG. 4 is a semiconductor structure 400 after a subsequent process step of depositing a sacrificial layer 412, in accordance with illustrative embodiments. In embodiments, the sacrificial layer 412 may comprise amorphous silicon (a-Si), and may be deposited via a chemical vapor deposition (CVD) process. A mask layer 414 is then deposited on the sacrificial layer 412. In some embodiments, the mask layer 414 may comprise oxide. In other embodiments, mask layer 414 may comprise a resist layer.

FIG. 5 is a semiconductor structure 500 after a subsequent process step of patterning the sacrificial layer to form sacrificial regions 512, in accordance with illustrative embodiments. The mask layer 514 is patterned into various discrete regions. This may be accomplished through industry-standard lithographic and patterning methods. The sacrificial region is then anisotropically etched to form discrete regions. In some embodiments, a reactive ion etch (RIE) process may be used. A mixture of inert gas and etchant gas may also be used as part of the etch process. Each sacrificial region 512 is in an inverted trapezoid shape, where it has a base portion 512B that is wider than a top portion 512T. The sacrificial regions 512 have an acute lower interior angle X. In some embodiments, the angle X may range from about 84 degrees to about 88 degrees. The angle X can be controlled by adjusting various etch parameters, such as the ratio of inert gas (e.g., argon or helium) to etchant gas (e.g., $CF_4$, $CHF_3$). Other parameters such as control of plasma power level and magnetic fields may also be adjusted to control the angle X.

FIG. 6 is a top-down view of a semiconductor structure 600 in accordance with illustrative embodiments. Sacrificial regions 612 are arranged orthogonal to epitaxial regions 608, which may be fins used in forming finFETs. FIG. 5 is a cross-section view as viewed along line A-A' of FIG. 6.

FIG. 7 is a semiconductor structure 700 similar to that of FIG. 5, shown in a "source/drain" cross-section view along line B-B' of FIG. 6. In this view, the sacrificial region 712 is disposed on multiple epitaxial regions 708. The epitaxial regions may have upper portion 721 which grows in a faceted manner as illustrated. The CESL layer 710 is deposited on the epitaxial regions 708 to protect them during various fabrication process steps. It is preferable to preserve as much volume of the upper portion 721 as possible in order to maximize contact area, and thus reduce contact resistance, improving the overall performance of the integrated circuit.

FIG. 8 is a semiconductor structure 800 after a subsequent process step of depositing an oxide layer 824, in accordance with illustrative embodiments. FIG. 8 is a "gate" cross-section, as viewed along line A-A' of FIG. 6. In embodiments, the oxide layer 824 may be deposited via a chemical vapor deposition (CVD) process. Optionally, a planarization process, such as a chemical mechanical polish process, may be used for forming a planar oxide surface. The oxide layer 824 is then recessed to be flush with the top of sacrificial regions 812. In some embodiments, the recess process may include a reactive ion etch (RIE) process, SiCoNi (silicon cobalt nickel) recess, or a chemical oxide recess (COR) process. In some embodiments, oxide layer 824 may be a flowable oxide.

FIG. 9 is a semiconductor structure 900 after a subsequent process step of removing the sacrificial layer, forming voids 926 in accordance with illustrative embodiments. In some embodiments, the sacrificial layer may be removed using a tetramethylammonium hydroxide (TMAH) etch process, which stops on the CESL layer (810 of FIG. 8). Next, the CESL layer is removed to expose epitaxial regions 908. In embodiments, the CESL layer is removed with an isotropic etch process. In some embodiments, a hot phosphorous replacement etch technique is used, providing sufficient selectivity to the gate sidewall spacer material. The etch process to remove the CESL layer is preferably highly selective such that it does not remove gate protective layer 906.

FIG. 10 is a semiconductor structure 1000 after a subsequent process step of depositing a metal contact material 1028, in accordance with illustrative embodiments. The metal contact material 1028 may be deposited via a chemical vapor deposition process. In embodiments, the metal contact material 1028 may be comprised of titanium, nickel, titanium nitride, metal oxides, tungsten, or alloys thereof. In some embodiments, copper or aluminum or cobalt, or alloys thereof may be used for metal contact material 1028. A planarization process, such as a chemical mechanical polish process, is then used to planarize the metal contact material to the level of the top of the oxide regions 1024.

FIG. 11 is a semiconductor structure 1100, which is similar to that of FIG. 10, shown in a "source/drain" cross-section view, along line B-B' of FIG. 6. Metal contact 1112 is in the form of an inverted trapezoid, where top contact surface 1112T is narrower than bottom contact surface 1112B. That is, top contact surface 1112T has a width W1, and bottom contact surface 1112B has a width W2, and W1 is less than W2. In embodiments, angle X ranges from about 84 degrees to about 88 degrees. In some embodiments, angle X ranges from about 86 degrees to about 87 degrees. Metal contact 1112 is in direct physical contact with the epitaxial regions 1108, and current can flow between contact 1112 and epitaxial regions 1108.

FIG. 12 is a semiconductor structure 1200 after a subsequent process step of patterning the sacrificial layer, in accordance with alternative illustrative embodiments. FIG. 12 is a "gate" cross-section view, as along line A-A' of FIG. 6. FIG. 12 follows from FIG. 4, but instead of patterning individual sacrificial regions as in FIG. 5, a single, larger sacrificial region 1212 is formed by patterning mask layer 1214 accordingly.

FIG. 13 is a semiconductor structure 1300 after a subsequent process step of depositing an oxide layer 1324, in accordance with alternative illustrative embodiments. In embodiments, the oxide layer 1324 may be deposited via a chemical vapor deposition (CVD) process. Optionally, a planarization process, such as a chemical mechanical polish process, may be used for forming a planar oxide surface. The oxide layer 1324 is then recessed to be flush with the top of sacrificial regions 1312. In some embodiments, the recess process may include a SiCoNi (silicon cobalt nickel) recess, or a chemical oxide recess (COR) process. In some embodiments, oxide layer 1324 may be a flowable oxide.

FIG. 14 is a semiconductor structure 1400 after a subsequent process step of removing the sacrificial layer, forming a void 1426, in accordance with alternative illustrative embodiments. In some embodiments, the sacrificial layer may be removed using a tetramethylammonium hydroxide (TMAH) etch process, which stops on the CESL layer (1310 of FIG. 13). Next, the CESL layer is removed to expose epitaxial regions 1408. In embodiments, the CESL layer is removed with an isotropic etch process. In some embodiments, a hot phosphorous replacement etch technique is used. The etch process to remove the CESL layer is preferably highly selective such that it does not remove gate protective layer 1406.

FIG. 15 is a semiconductor structure 1500 after a subsequent process step of depositing a metal contact material, in accordance with alternative illustrative embodiments. The metal contact material 1540 may be deposited via a chemical vapor deposition process. In embodiments, the metal contact material 1540 may be comprised of tungsten, or alloys thereof. In some embodiments, copper or aluminum, or alloys thereof may be used for metal contact material 1540. A planarization process, such as a chemical mechanical polish process, is then used to planarize the metal contact material to the level of the top of the gate protective layer 1506 (unlike the embodiment of FIG. 10, where the contact extends above the level of the top of the gate protective layer), and the oxide regions 1424 are removed. The metal regions 1540 serve as a first level contact (or "TS" contact) that form a first (lower) contact, on which a second (upper) contact is formed.

FIG. 16A is a source/drain cross-section of a semiconductor structure 1600 after subsequent steps of forming additional contacts. In embodiments, first (lower) contact 1640 has a height H1 that extends from the epitaxial regions up to the level of the protective layer 1606 of gate 1604, such that contact 1640 is flush with the protective layer 1606 on top of gate 1604. In some embodiments, contact 1640 may be flush with gate 1604. Contact 1640 is in direct physical contact with upper portion 1621 of epitiaxial regions 1608, thus forming a source/drain contact. First contact 1640 has an acute lower interior angle X. In embodiments, the interior angle X ranges from about 84 degrees to about 88 degrees. Disposed on first contact 1640 is second (upper) contact 1642. In embodiments, contact 1642 may also be formed inverted as shown in FIG. 16A. In alternative embodiments, contact 1642 may be a traditional, non-inverted contact, so long as there is sufficient space between gate (CB) contact 1644 and second contact 1642. However, by inverting the second contact, an increased distance S1 between the gate contact 1644 and second (upper) contact 1642 may be achieved. The distance S1 represents a potential "pinch point" with conventional contacts. In conventional contacts, as the height increases, the width increases, which eventually could touch other adjacent contacts, causing a short. With the inverted contacts provided by embodiments of the present invention, the width decreases as the height increases, and thus the pinch point issue is solved. In some embodiments, the first contact 1640 may have a height H1 ranging from about 70 nanometers to about 90 nanometers. In some embodiments, the second contact 1642 may have a height ranging from about 30 nanometers to about 50 nanometers. The embodiment of FIG. 16A with the two part contact structure (using contacts 1640 and 1642) is well suited for smaller critical dimensions that require double patterning of contacts.

FIG. 16B is a source/drain cross-section of a semiconductor structure 1601 after subsequent steps of forming additional contacts for alternative embodiments. Semiconductor structure 1601 is similar to semiconductor structure 1600 of FIG. 16A, except that the contact 1641 is of a single metal region having a height H3. In embodiments, height H3 ranges from about 90 nanometers to about 120 nanometers. Contact 1641 is in direct physical contact with upper portion 1621 of epitaxial regions 1608, thus forming a source/drain contact. The top surface 1641T of contact 1641 extends above protective layer 1606 disposed on the gate 1604. The embodiment of FIG. 16B with the one part contact structure 1641 is well suited for critical dimensions that allow a sufficient gap S2 between the gate contact 1644 and the source/drain contact 1641. With this embodiment, the additional process steps for the two-part embodiment are not required.

FIG. 17 is a flowchart 1700 indicating process steps for embodiments of the present invention. In process step 1750, a protective layer (including spacers) is formed over the gates. In process step 1752, epitaxial regions are formed on the semiconductor substrate. These may include fins for finFET transistors. In process step 1754, a contact etch stop layer (CESL) is deposited. In process step 1756, a sacrificial layer is deposited. In embodiments, the sacrificial layer is comprised of amorphous silicon (a-Si). In process step 1758, a mask is deposited. In process step 1759, the mask is patterned. In process step 1760, the sacrificial layer is patterned. In process step 1762, an oxide layer is deposited over the structure. In process step 1764, the sacrificial layer is removed. In process step 1766, a contact metal is deposited. In process step 1768, the structure is planarized. From this point forward, industry-standard processes may be used to complete the fabrication of the integrated circuit. This may include formation of additional dielectric layers, via layers, and metallization layers, as well as packaging processes.

As can now be appreciated, embodiments of the present invention enable placement of contacts in very close proximity to each other, which allows for increased circuit density. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor structure comprising:
   a semiconductor substrate;
   a transistor formed in the semiconductor substrate, wherein the transistor comprises a gate and a source/drain region comprising a faceted epitaxial silicon upper portion; and
   a contact disposed on and in direct physical contact with the faceted upper portion of the source/drain region, wherein the contact has a base portion that is wider than a top portion, and wherein the contact has an acute lower interior angle.

2. The structure of claim 1, wherein the interior angle ranges from about 84 degrees to about 88 degrees.

3. The structure of claim 1, wherein the contact extends above a protective layer disposed on the gate.

4. The structure of claim 1, wherein the contact has a height ranging from about 90 nanometers to about 120 nanometers.

5. The structure of claim 1, wherein the source/drain region comprises a plurality of epitaxial silicon regions.

6. The structure of claim 1, wherein the contact is comprised of tungsten.

7. A semiconductor structure comprising:
   a semiconductor substrate;
   a transistor formed in the semiconductor substrate, wherein the transistor comprises a gate and a source/drain region;
   a first contact disposed on and in direct physical contact with the source/drain region, wherein the first contact has a base portion that is wider than a top portion, and wherein the first contact has an acute lower interior angle; and
   a second contact disposed on the first contact.

8. The structure of claim 7, wherein the interior angle of the first contact ranges from about 84 degrees to about 88 degrees.

9. The structure of claim 7, wherein the first contact is flush with the gate.

10. The structure of claim 7, wherein the first contact has a height ranging from about 70 nanometers to about 90 nanometers.

11. The structure of claim 7, wherein the second contact has a height ranging from about 30 nanometers to about 50 nanometers.

12. The structure of claim 7, wherein the source/drain region comprises a plurality of epitaxial silicon regions.

13. The structure of claim 7, wherein the first contact and second contact are comprised of tungsten.

14. The structure of claim 7, wherein the second contact has a base portion that is wider than a top portion, and wherein the second contact has an acute lower interior angle.

15. The structure of claim 14, wherein the interior angle of the second contact ranges from about 84 degrees to about 88 degrees.

* * * * *